(12) United States Patent
Epstein

(10) Patent No.: US 7,075,815 B2
(45) Date of Patent: Jul. 11, 2006

(54) SPIN DRIVEN RESISTORS AND NANOGATES

(75) Inventor: Arthur J. Epstein, Bexley, OH (US)

(73) Assignee: The Ohio State University, Columbus, OH (US)

( * ) Notice: Subject to any disclaimer, the term of this patent is extended or adjusted under 35 U.S.C. 154(b) by 195 days.

(21) Appl. No.: 10/665,253

(22) Filed: Sep. 19, 2003

(65) Prior Publication Data

US 2004/0109350 A1    Jun. 10, 2004

Related U.S. Application Data

(60) Provisional application No. 60/411,923, filed on Sep. 19, 2002.

(51) Int. Cl.
*G11C 11/00* (2006.01)
(52) U.S. Cl. .................................. 365/158; 977/DIG. 1
(58) Field of Classification Search ................. 365/158, 365/171; 977/DIG. 1, 902, 932, 933, 935
See application file for complete search history.

(56) References Cited

U.S. PATENT DOCUMENTS

| | | | | |
|---|---|---|---|---|
| 4,875,010 | A | * | 10/1989 | Yokosawa et al. .......... 324/248 |
| 5,654,590 | A | * | 8/1997 | Kuramochi ................. 257/778 |
| 6,172,902 | B1 | | 1/2001 | Wegrowe et al. ........... 365/158 |
| 6,249,453 | B1 | | 6/2001 | You et al. ................... 365/171 |
| 6,347,022 | B1 | | 2/2002 | Saito .......................... 360/126 |
| 6,381,171 | B1 | | 4/2002 | Inomata et al. ............. 365/173 |
| 6,753,562 | B1 | | 6/2004 | Hsu et al. ................... 257/295 |
| 6,864,418 | B1 | * | 3/2005 | Wang et al. ........... 174/35 MS |
| 2002/0097598 | A1 | | 7/2002 | Hoenigschmid ............. 365/97 |

* cited by examiner

*Primary Examiner*—Richard Elms
*Assistant Examiner*—Hien N Nguyen
(74) *Attorney, Agent, or Firm*—Standley Law Group LLP

(57) ABSTRACT

A spin driven resistor including a magnetic body whose resistance increases due to resonance when subjected to an externally applied magnetic field while in the presence of an externally applied electromagnetic field is presented. The spin driven resistor has applications in a variety of spintronic devices including read heads and detectors that are very fast and operate and low power. The spin driven resistor may also be used to modulate spin value, spin tunnel junction, spin-LED, and spin-transistor devices by exposing the device to an electromagnetic field and a magnetic field.

10 Claims, 8 Drawing Sheets

SPIN DRIVEN RESISTORS AND NANOGATES

This application claims the benefit of U.S. Provisional Application Serial No. 60/411,923, filed on Sep. 19, 2002, which is incorporated herein by reference.

TECHNICAL FIELD OF THE INVENTION

This invention relates to spintronic devices. Specifically, this invention relates to spin driven resistors and spin driven nanogates.

BACKGROUND OF THE INVENTION

The term "spintronics" refers to a new generation of electronic devices that make use of the electron spin as well as its charge. It is anticipated that spintronic devices will have superior properties compared to their semiconductor counterparts based on reduced power consumption due to their inherent nonvolatility, elimination of the initial booting-up of random access memory, rapid switching speed, ease of fabrication, and large number of carriers and good thermal conductivity of metals. Such devices include giant magnetoresistance (GMR) and tunneling magnetoresistance (TMR) structures that consist of ferromagnetic films separated by metallic or insulating layers, respectively. Switching of the magnetization direction of such elementary units is by means of an external magnetic field that is generated by current pulses in electrical leads that are in proximity.

As used herein, the term "resonance" shall mean the process by which the wave amplitude and probability are transferred between two degenerate states in a manner analogous to the energy transfer between two harmonic oscillators. As used herein, the term "resonance absorption" shall mean the absorption of radiation by an atom (or molecule) at a frequency corresponding to some transition between stationary states. As used herein, the term "resonance frequency" shall mean the frequency at which resonance absorption occurs; the difference between some pair of atomic energy levels divided by Planck's constant.

One of the goals of the present invention to provide spin driven resistors and nanogates.

SUMMARY OF THE INVENTION

The present invention presents a novel approach for new types of "spintronic" devices called spin driven resistors (SDR) or spin driven nanogates (SDN). In a spintronic device of the present invention, a magnetic body is in electrical communication with two wires. Each of the wires is connected to a voltage source so as to place a potential across the magnetic body. The magnetic body has a resistance that is capable of changing when the magnetic body is subjected to an applied magnetic field while in the presence of an electromagnetic field. The ratio of change in resistance over resistance for the magnetic body is maximized when the magnetic field is at the resonance frequency of the magnetic body for a given electromagnetic field. Increasing the power of the applied electromagnetic field increases the magnitude of the ratio of change in resistance over resistance. The magnitude of the ratio of change in resistance over resistance decreases with increasing temperatures.

In a preferred spintronic device of the present invention, the magnetic body comprises a material selected from the group of metallic and semi-conducting magnets. It is most preferred that the magnetic body comprise vanadium di-tetracyanoethanide ($V[TCNE]_2$).

It is preferred that a spintronic device of the present invention be held at a constant temperature while being subjected to the externally applied electromagnetic field and/or the externally applied magnetic field. It is more preferred that the externally applied electromagnetic field comprise microwave radiation. It is most preferred that the microwave radiation have an applied power in the range of about 1 mW to about 25 mW. It is further preferred that the externally applied magnetic field comprise a direct-current (DC) magnetic field.

DETAILED DESCRIPTION OF THE PREFERRED EMBODIMENT(S)

The present invention includes new types of "spintronic" devices that are termed "spin driven resistor" (SDR) or "spin driven nanogate" (SDN). These devices have potential as a platform technology for information storage and processing as well as in other uses. Examples include magnetic read heads and detectors.

In developing the spin driven resistor (SDR) of the present invention, a magnetic body was placed in electrical communication with two conducting wires. The wires were each connected to a voltage source so as to place a potential across the magnetic body. The resistance of the magnetic body was then measured, for example with a voltmeter. The magnetic body's resistance was monitored with the voltmeter as the SDR was subjected to an externally applied dc magnetic field. Additionally, a time varying electromagnetic field acted upon the SDR. As the dc magnetic field is increased or decreased so as to pass the value of 'resonance' to occur so that electromagnetic energy is absorbed, there is a change in the resistance of the sample (increase or decrease), termed the spin driven resistance due to activation of the spin driven nanogate.

Metallic or semi-conducting magnets with a substantial excess of one polarization of conduction carrier spin polarization over the opposite of spin polarization are preferred.

Figure 1A:
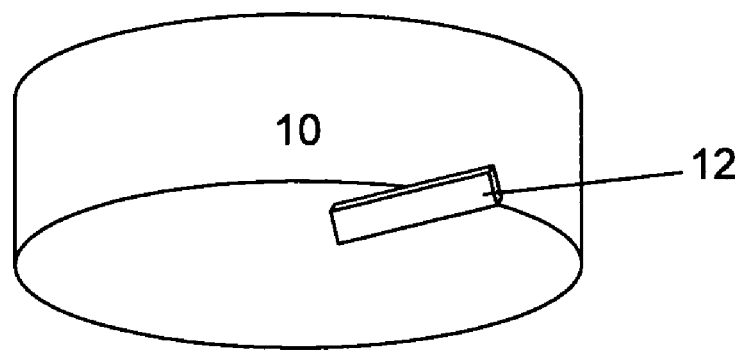
FIG. 1a is an illustration of a 5 μm coating of the organic V[TCNE]2 magnet on a glass cover slide being attracted to a $Co_5Sm$ magnet at room temperature in the air.
Figure 1B:
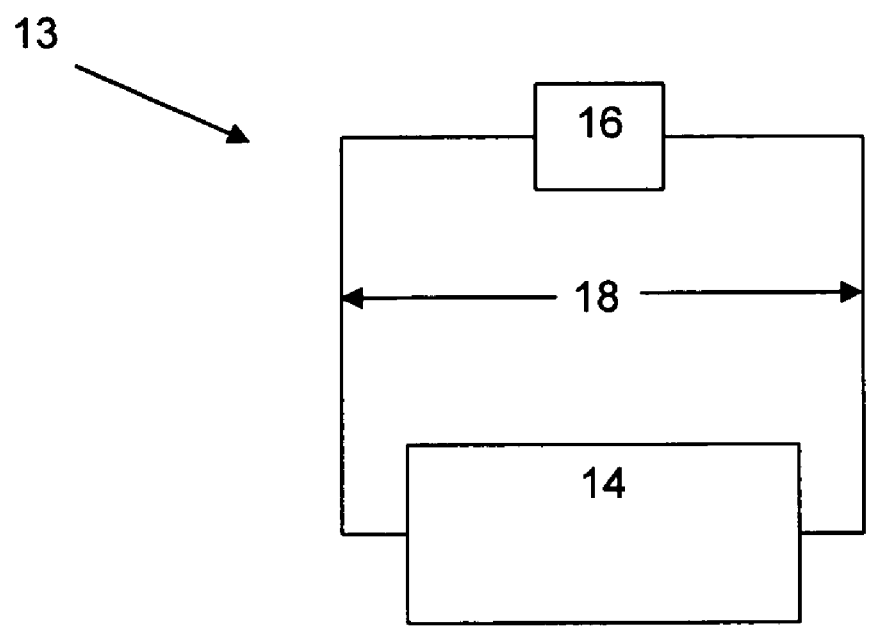
FIG. 1b is an illustration of one embodiment of a spin driven resistor produced in accordance with present invention.
Figure 2:
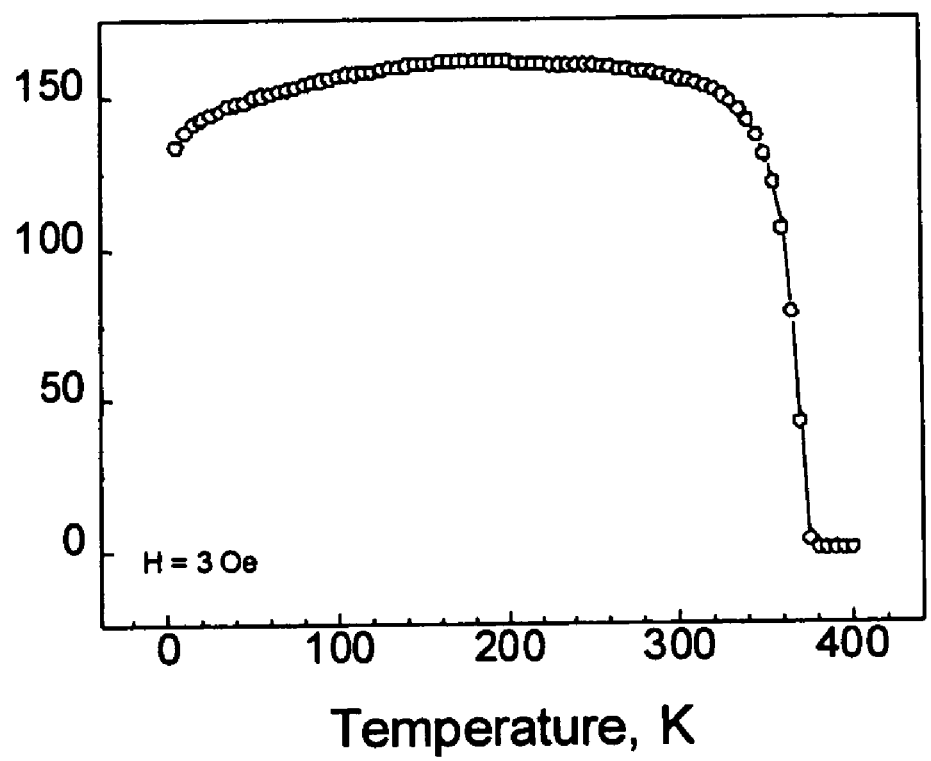
FIG. 2 shows the magnetization (emu/mol) as a function of temperature showing ordering at 370K for the organic magnet shown in FIG. 1.
Figure 3:
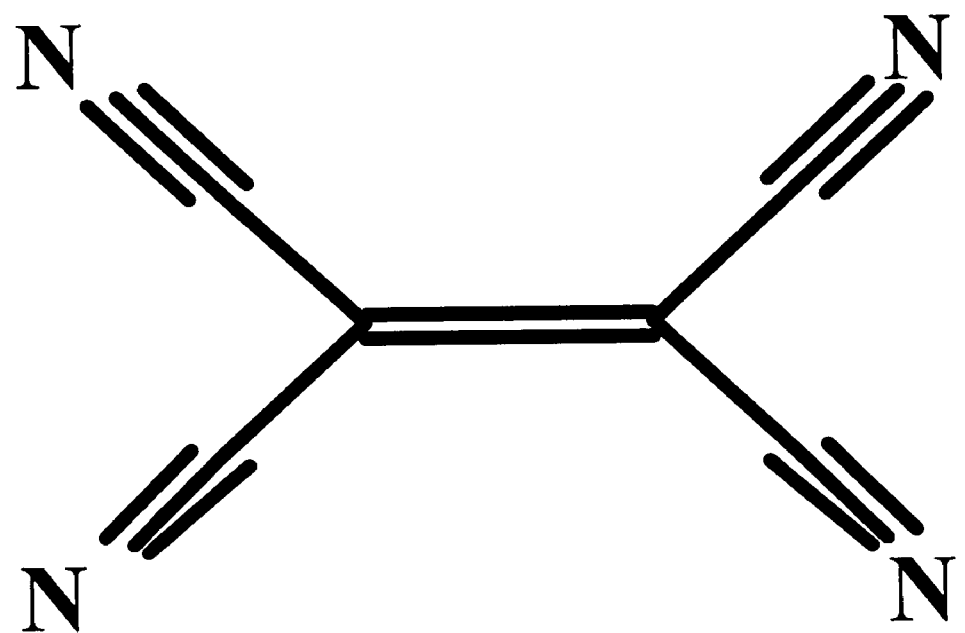
FIG. 3 illustrates the chemical structure of tetracyanoethanide.

A spin driven resistor of the present invention was developed using the "half semi-conductor" $V[TCNE]_x$. FIG. 1a is an illustration of a 5 µm coating of the organic $V[TCNE]_2$ magnet on a glass cover slide 12 being attracted to a $Co_5Sm$ magnet 10 at room temperature in air. FIG. 1b is an illustration of a spin driven resistor 13 produced in accordance with the present invention. As is shown, spin driven resistor 13 comprises a magnetic body 14 in electrical communication with voltage source 16 via electrical connections (which may be wires) 18. FIG. 2 shows the magnetization (emu/mol) as a function of temperature for the organic $V[TCNE]_2$ magnet shown in FIG. 1a. As can be seen from FIG. 2, the organic $V[TCNE]_2$ magnet shows ordering at 370K. The chemical structure of tetracyanoethanide is shown in FIG. 3. The newly achieved SDR is a spin-dependent quantum effect active at room temperature.

Figure 4:
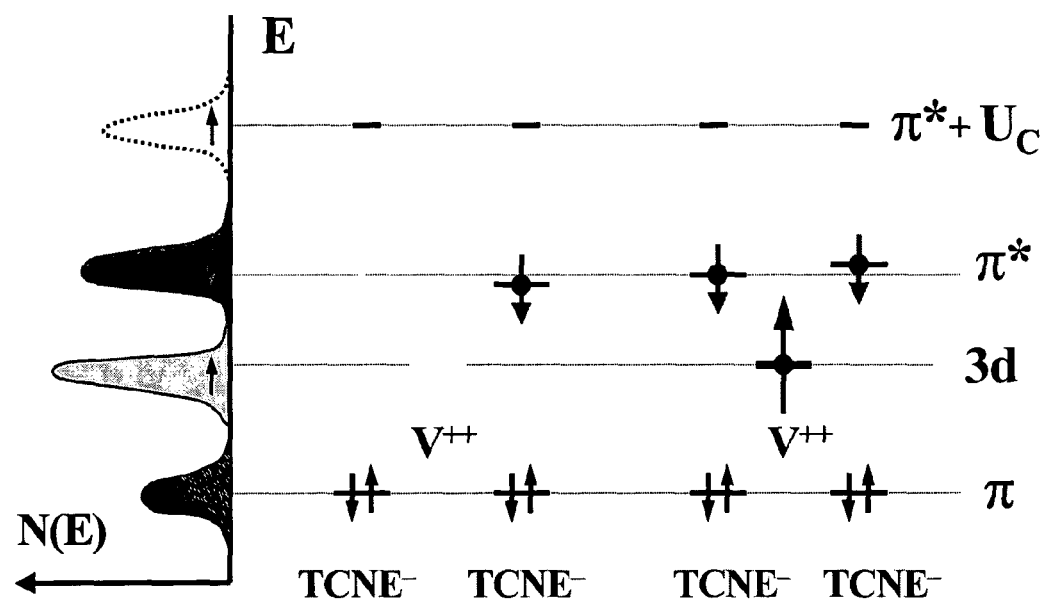
FIG. 4 is a schematic level diagram for $V[TCNE]_2$ showing the half-filled Π*-band of $TCNE^-$ split into two non-overlapping spin-subbands.

FIG. 4 is a schematic diagram for $V[TCNE]_2$ showing the half-filled $\Pi^*$-band of $TCNE^-$ split into two non-overlapping spin-subbands.

Figure 5:
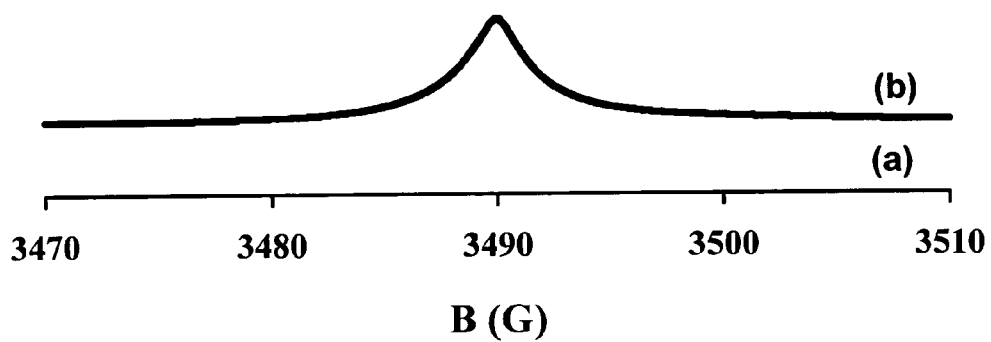
FIG. 5 illustrates derivative (a) and absorption (b) curves for 9.5 GHz EPR of $V[TCNE]_x$ at 2.02 mW of applied microwave power at 290K.

FIG. 5 shows the 290 K electron paramagnetic resonance derivative signal (a) measured for $V[TCNE]_x$ films (prepared via low-temperature (40° C.) chemical vapor deposition) that are magnetic at room temperature. Also shown in FIG. 5 is the absorption curve (b) that represents the power absorbed by the sample. As expected, it was found that the EPR line shape and center field depend upon the angle of the $V[TCNE]_x$ films with respect to the applied magnetic field.

Figure 6:
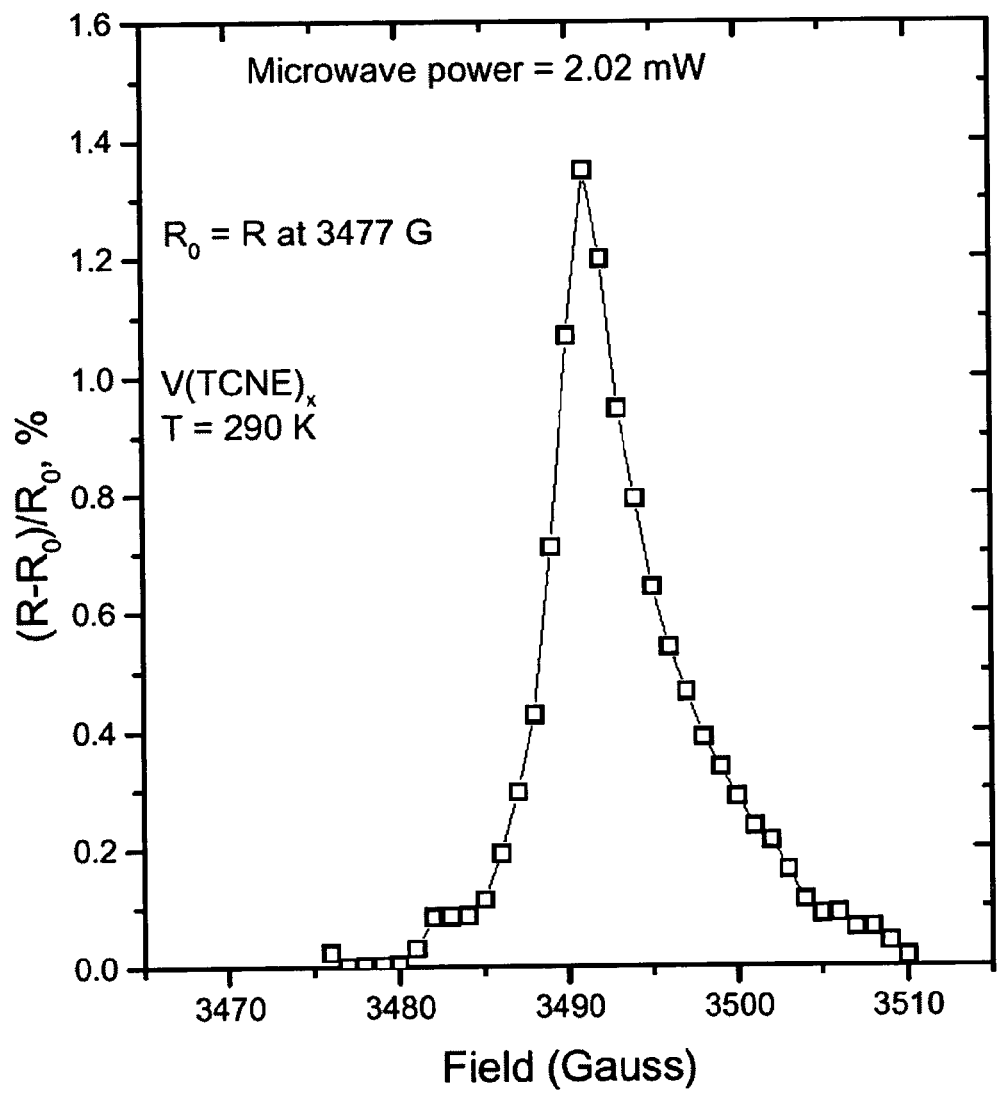
FIG. 6 illustrates the ΔR/R versus applied magnetic field for applied 9.5 GHz microwave power of 2.02 mW applied to $V[TCNE]_x$ films at 290K.
Figure 7:
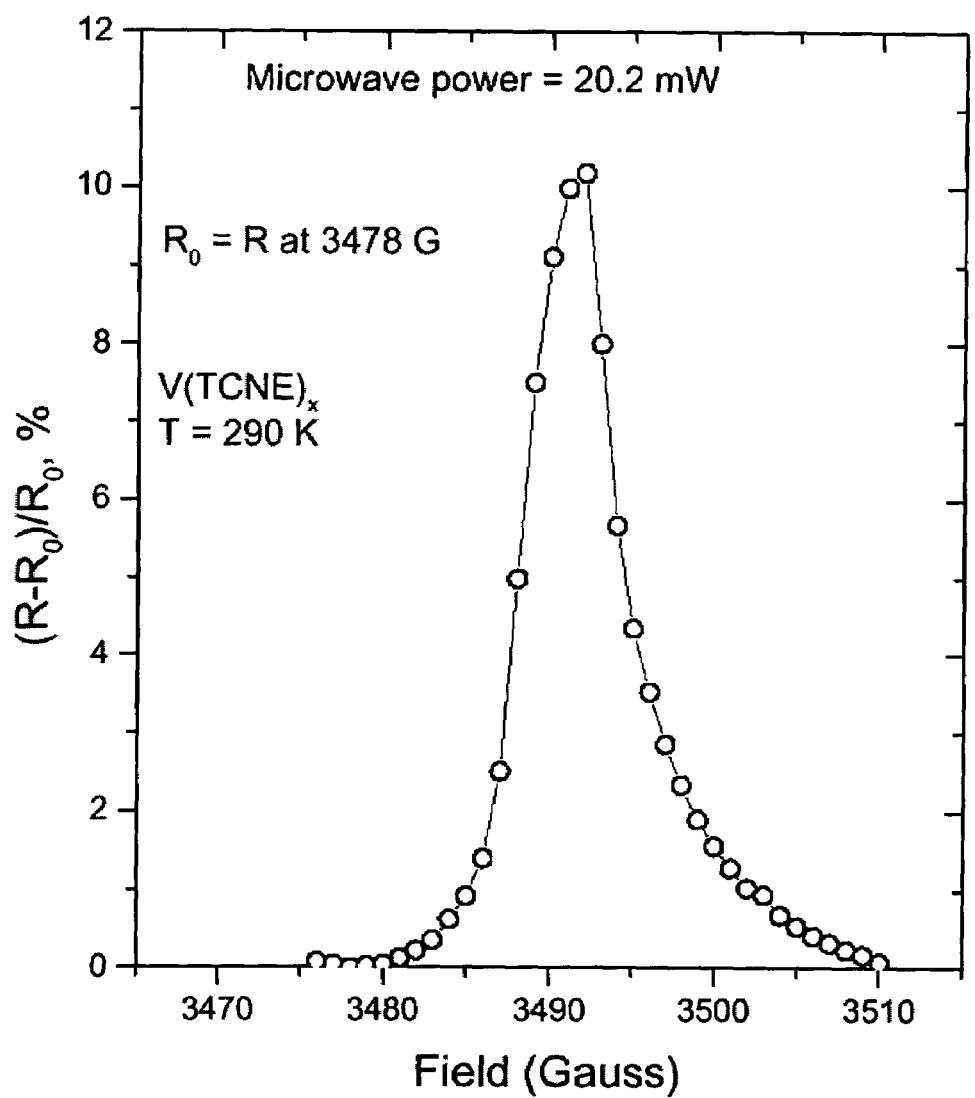
FIG. 7 illustrates the ΔR/R versus applied magnetic field for applied 9.5 GHz microwave power of 20.2 mW applied to $V[TCNE]_x$ films at 290K.

FIGS. 6 and 7 illustrate the percentage change in resistance at 290 K of the $V[TCNE]_x$ film as a function of the applied magnetic field for 2 mW and 20 mW of applied 9.5 GHz microwave power respectively. As the magnetic field sweeps past the field for resonance (3492 Oersted), the resistance dramatically increases. As seen in FIG. 6, a $\Delta R/R$ of 1.3% is achieved for 2 mW of applied microwave power. The SDR increases nearly linearly to a $\Delta R/R$ of 10.5% for applied microwave power of 20 mW as shown in FIG. 7. The shape of the $\Delta R/R$ versus magnetic field curve mimics that of the EPR absorption curve.

Figure 8:
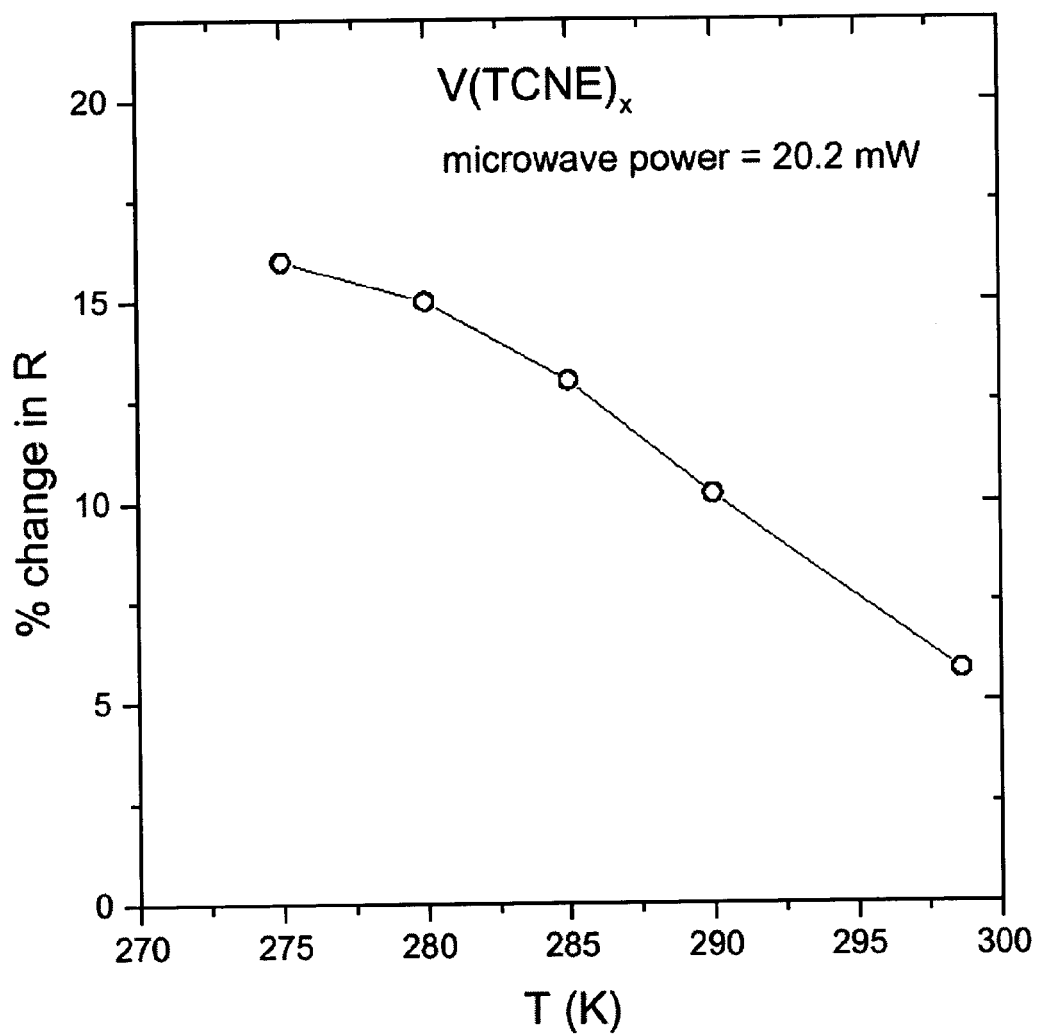
FIG. 8 represents the 20.2 mW ΔR/R as a function of temperature from 275K to 298K.

FIG. 8 presents the $\Delta R/R$ as a function of temperature from 275 K to 298 K for a $V[TCNE]_x$ film subjected to 20.2 mW of microwave radiation. The $\Delta R/R$ decreases three-fold as the temperature is increased across this temperature range.

A proposed mechanism for spin driven resistor operation may be understood by viewing FIG. 4. The $V[TCNE]_x$ is proposed to be a half semi-conductor with a filled lower Hubbard energy band centered on the TONE sites (one electron per site). The magnetic exchange coupling of the spin $S=\frac{1}{2}$ of $TCNE^-$ sites with the $S=\frac{3}{2}$ of $V^{2+}$ sites result in all of the sites in this lower Hubbard band being in the same spin direction. With<2, typical of samples made, the upper Hubbard band is assumed partly occupied with electrons with spin opposite to that of the electrons in the lower Hubbard band due to the Pauli exclusion principle. The conductivity is by hopping among states in the upper Hubbard band.

It is further believed that at resonance, the applied microwave field flips some of the spins in the lower Hubbard band of localized states. These 'inverted' states then block passage of the spin (and associated charge) in the upper Hubbard band thereby increasing the resistance. In essence, each $TCNE^-$ becomes a "spin-driven nanogate". At finite temperatures some thermally reversed spins already exist. By lowering the temperature, the ratio of minority to majority spin sites decreases making the effect of spin flip due to resonant microwave field larger, in agreement with FIG. 8.

The operation of spin driven resistors is sharply dependent on the applied magnetic field, with the magnetic field for SDR tunable by choice of applied resonance frequency. For example, use of ~20 MHz frequency would lead to SDR at ~7 Oe applied field for the $V[TCNE]_x$ based devices.

It is noted that SDR may have eventual application in a variety of spintronic devices, including read heads and detectors that are very fast and operate at low power. The SDR phenomenon may also be used to modulate spin valve, spin tunnel junction, spin-LED, and spin-transistor devices by exposing the magnetic semi-conductor or conductor layer to a time varying electromagnetic field and a dc magnetic field so as to pass through a resonance condition.

While the invention has been described in connection with what is presently considered to be the most practical and preferred embodiments, it is to be understood that the invention is not to be limited to the disclosed embodiment, but on the contrary, is intended to cover various modifications and equivalent arrangements included within the spirit and scope of the appended claims, which are incorporated herein by reference.

What is claimed is:

1. A spin driven resistor comprising:
   a magnetic body having a resistance and a resonance frequency, said resistance capable of changing in response to an applied magnetic field while in the presence of an electromagnetic field; and
   a voltage source in electrical communication with said magnetic body so as to place a potential across said magnetic body, wherein said magnetic body reaches a maximum value of change in resistance when said magnetic body is subjected to an externally applied magnetic field while in the presence of an externally applied electromagnetic field.

2. The spin driven resistor according to claim 1 wherein said magnetic body comprises a material selected from the group consisting of metallic and semi-conducting magnets.

3. The spin driven resistor according to claim 1 wherein said magnetic body comprises vanadium di-tetracyanoethanide.

4. The spin driven resistor according to claim 1 wherein said spin driven resistor is subjected to said externally applied electromagnetic field while at a constant temperature.

5. The spin driven resistor according to claim 1 wherein said spin driven resistor is subjected to said externally applied magnetic field while at a constant temperature.

6. The spin driven resistor according to claim 1 wherein said externally applied magnetic field is an externally applied direct-current magnetic field.

7. The spin driven resistor according to claim 1 wherein said externally applied electromagnetic field comprises microwave radiation.

8. The spin driven resistor according to claim 7 wherein said microwave radiation has a power in the range of about 1 mW to about 25 mW.

9. The spin driven resistance according to claim 1 wherein said maximum value of change in resistance increases as said electromagnetic field increases in power.

10. The spin driven resistance according to claim 1 wherein said maximum value of change in resistance decreases as temperature increases.

* * * * *

UNITED STATES PATENT AND TRADEMARK OFFICE
CERTIFICATE OF CORRECTION

| | |
|---|---|
| PATENT NO. | : 7,075,815 B2 |
| APPLICATION NO. | : 10/665253 |
| DATED | : July 11, 2006 |
| INVENTOR(S) | : Epstein |

It is certified that error appears in the above-identified patent and that said Letters Patent is hereby corrected as shown below:

In column 2, line 17, please delete "V[TCNE]2" and insert -- $V[TCNE]_2$ --.

In column 3, line 50, please delete "TONE" and insert -- TCNE --.

In column 3, line 54, please delete "With<2," and insert -- With x < 2 --.

Signed and Sealed this

Twenty-ninth Day of August, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,075,815 B2 |
| APPLICATION NO. | : 10/665253 |
| DATED | : July 11, 2006 |
| INVENTOR(S) | : Epstein |

It is certified that error appears in the above-identified patent and that said Letters Patent is hereby corrected as shown below:

In column 2, line 17, please delete "V[TCNE]2" and insert -- $V[TCNE]_2$ --.

In column 3, line 50, please delete "TONE" and insert -- $TCNE^-$ --.

In column 3, line 54, please delete "With<2," and insert -- With $x < 2$ --.

This certificate supersedes Certificate of Correction issued August 29, 2006.

Signed and Sealed this

Twenty-eighth Day of November, 2006

JON W. DUDAS
*Director of the United States Patent and Trademark Office*